United States Patent
Krivokapic et al.

(10) Patent No.: US 6,921,963 B2
(45) Date of Patent: *Jul. 26, 2005

(54) NARROW FIN FINFET

(75) Inventors: Zoran Krivokapic, Santa Clara, CA (US); Judy Xilin An, San Jose, CA (US); Srikanteswara Dakshina-Murthy, Austin, TX (US); Haihong Wang, Fremont, CA (US); Bin Yu, Cupertino, CA (US)

(73) Assignee: Advanced Micro Devices, Inc, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/830,006

(22) Filed: Apr. 23, 2004

(65) Prior Publication Data

US 2004/0197975 A1 Oct. 7, 2004

Related U.S. Application Data

(63) Continuation of application No. 10/348,910, filed on Jan. 23, 2003, now Pat. No. 6,762,483.

(51) Int. Cl.[7] .............................................. H01L 29/06
(52) U.S. Cl. .................. 257/618; 257/327; 257/347
(58) Field of Search ................................ 257/618, 327, 257/347

(56) References Cited

U.S. PATENT DOCUMENTS

| 5,757,038 | A | 5/1998 | Wind et al. | |
|---|---|---|---|---|
| 6,300,182 | B1 | 10/2001 | Yu | 438/217 |
| 6,458,662 | B1 | 10/2002 | Yu | 438/286 |
| 6,472,258 | B1 | * 10/2002 | Adkisson et al. | 438/192 |
| 6,475,869 | B1 | 11/2002 | Yu | 438/303 |
| 6,583,469 | B1 | 6/2003 | Fried et al. | 257/329 |
| 6,630,388 | B2 | 10/2003 | Sekigawa et al. | 438/396 |
| 6,642,090 | B1 | 11/2003 | Fried et al. | 438/164 |
| 6,645,797 | B1 | 11/2003 | Buynoski et al. | 438/157 |
| 6,657,252 | B2 | 12/2003 | Fried et al. | 257/316 |
| 6,657,259 | B2 | 12/2003 | Fried et al. | 257/350 |
| 6,706,571 | B1 | 3/2004 | Yu et al. | 438/157 |
| 6,709,982 | B1 | 3/2004 | Buynoski et al. | 438/696 |
| 6,750,487 | B2 | * 6/2004 | Fried et al. | 257/270 |
| 6,768,158 | B2 | * 7/2004 | Lee et al. | 257/315 |
| 2002/0130354 | A1 | 9/2002 | Sekigawa | |
| 2002/0140039 | A1 | 10/2002 | Adkisson | |
| 2003/0042531 | A1 | 3/2003 | Lee et al. | 257/315 |
| 2004/0048424 | A1 | 3/2004 | Wu et al. | 438/154 |

FOREIGN PATENT DOCUMENTS

EP   1 202 335   5/2002

OTHER PUBLICATIONS

Digh Hisamoto et al.: "FinFET—A Self–Aligned Double–Gate MOSFET Scalable to 20 nm," IEEE Transactions on Electron Devices, vol. 47, No. 12, Dec. 2000, pp. 2320–2325.

(Continued)

Primary Examiner—David Nelms
Assistant Examiner—Tu-Tu Ho
(74) Attorney, Agent, or Firm—Harrity & Snyder LLP

(57) ABSTRACT

A narrow channel FinFET is described herein with a narrow channel width. A protective layer may be formed over the narrow channel, the protective layer being wider than the narrow channel.

10 Claims, 13 Drawing Sheets

OTHER PUBLICATIONS

Yang–Kyu Choi et al.: "Sub–20nm CMOS Fin FET Technologies," 0–7803–5410–9/99 IEEE, Mar. 2001, 4 pages.

Xuejue Huang et al.: "Sub–50 nm P–Channel Fin FET," IEEE Transactions on Electron Devices, vol. 48, No. 5, May 2001, pp. 880–886.

Yang–Kyu Choi et al.: "Nanoscale CMOS Spacer FinFET for the Terabit Era," IEEE Electron Device Letters, vol. 23, No. 1, Jan. 2002, pp. 25–27.

Xuejue Huang et al.: "Sub 50–nm FinFET: PMOS," 0–7803–7050–3/01 IEEE, Sep. 1999 4 pages.

Co–pending U.S. Appl. No. 10/614,052 filed Jul. 8, 2003 titled "Narrow Fins By Oxidation In Double–Gate FinFet," 11 page specification, 7 sheets of drawings.

Co–pending U.S. Appl. No. 10/699,887 filed Nov. 4, 2003 titled "Self Aligned Damascene Gate," 35 pages.

* cited by examiner

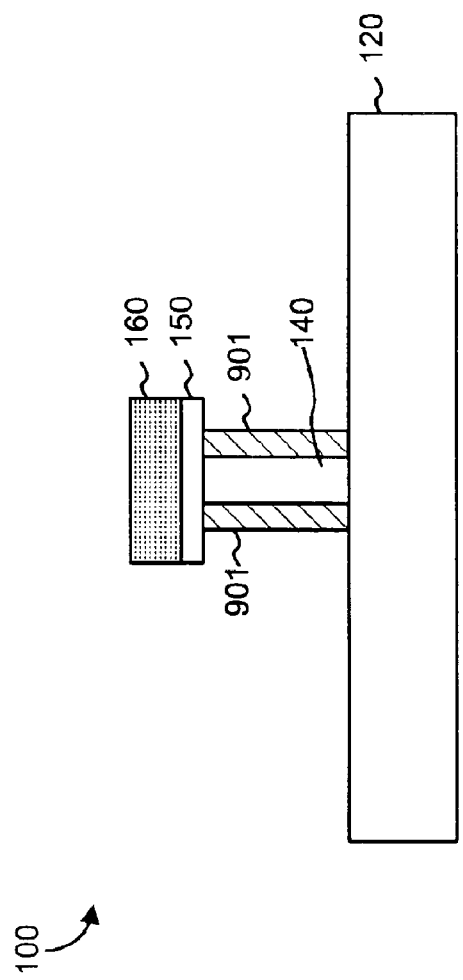
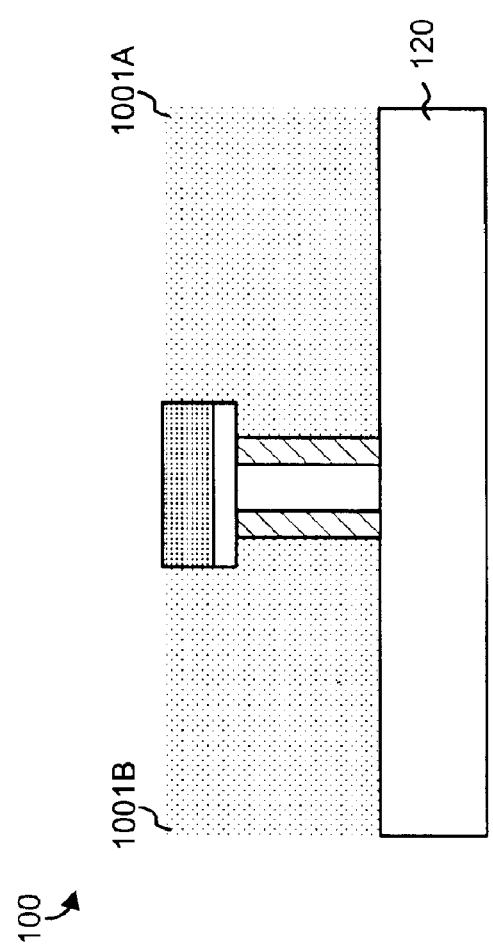

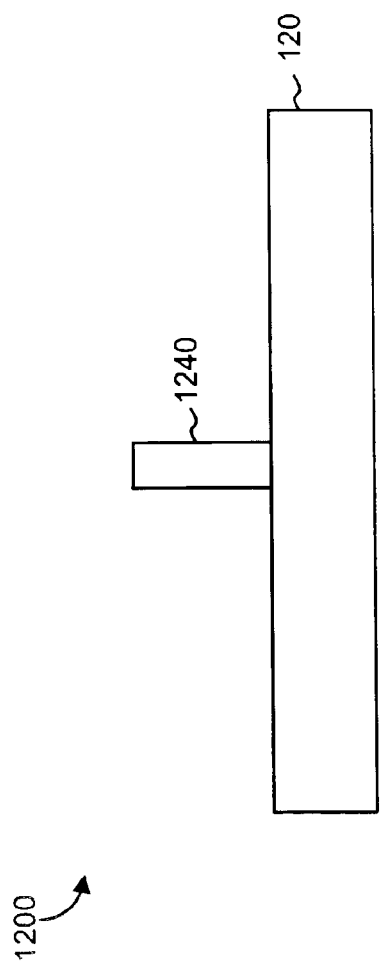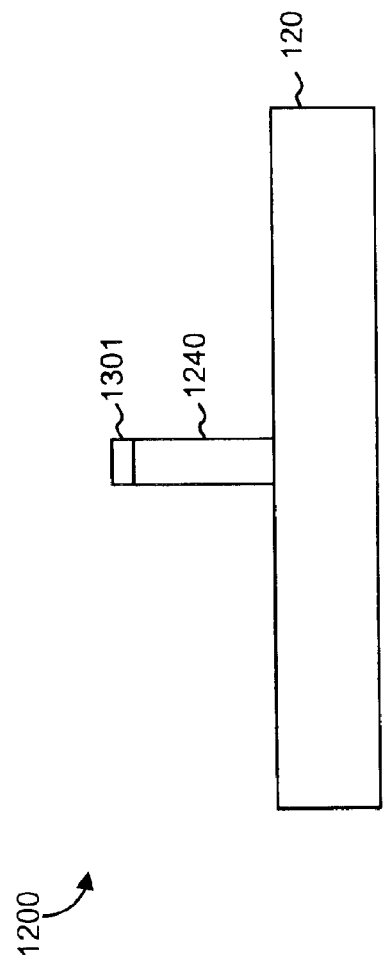

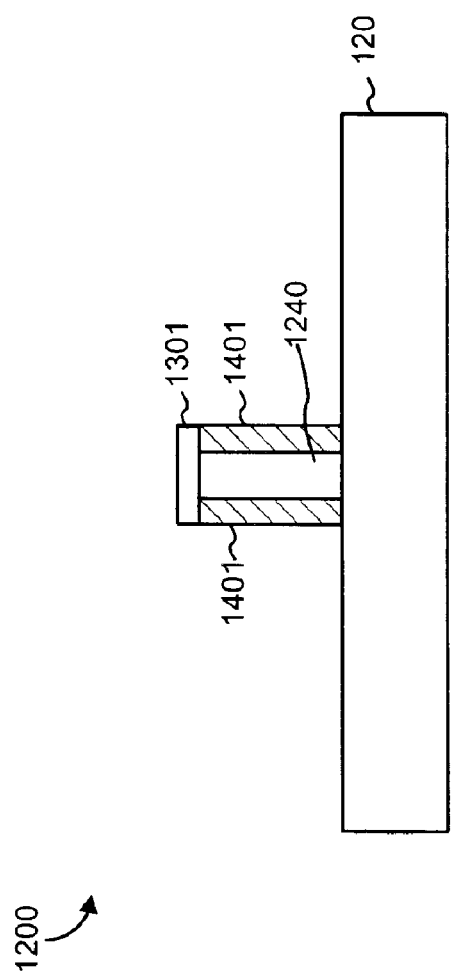
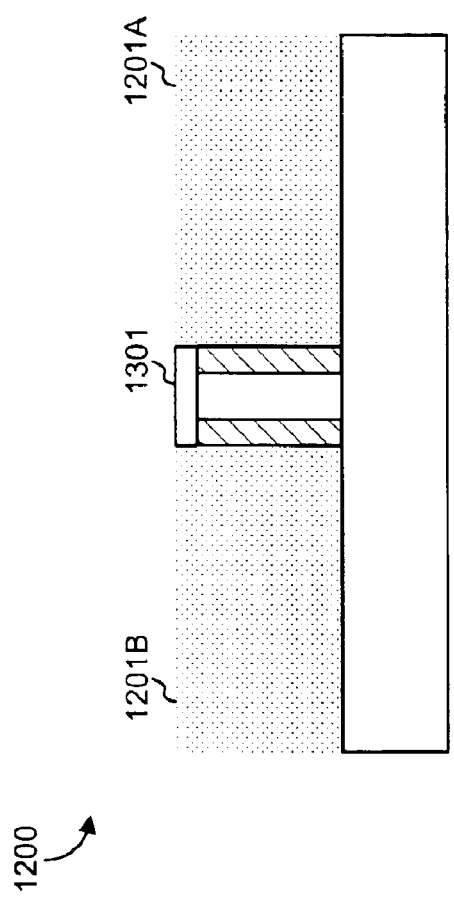

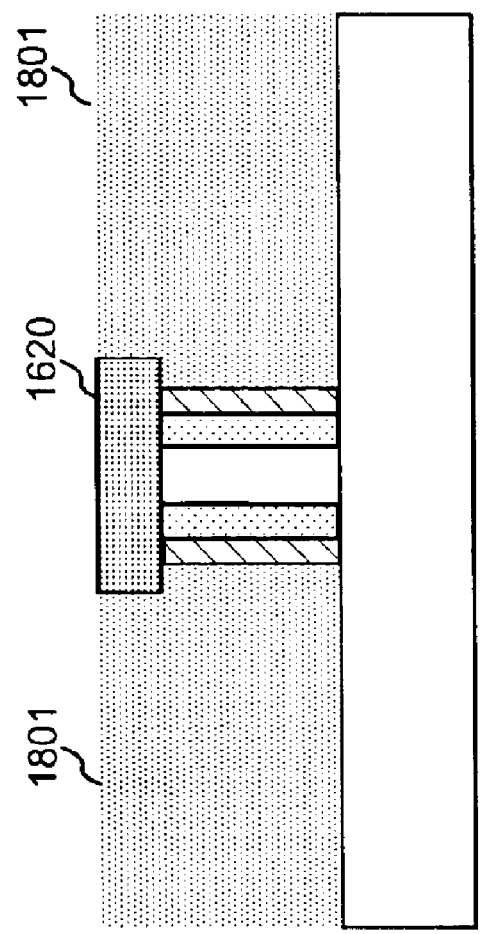

NARROW FIN FINFET

This application is a Continuation of commonly assigned, U.S. patent application Ser. No. 10/348,910, entitled "NARROW FIN FINFET", filed Jan. 23, 2003 now U.S. Pat. No. 6,762,483, the disclosure of which is hereby incorporated herein by reference.

BACKGROUND OF THE INVENTION

A. Field of the Invention

The present invention relates generally to semiconductor devices and methods of manufacturing semiconductor devices and, more particularly, to double-gate metal oxide semiconductor field-effect transistors (MOSFETs).

B. Description of Related Art

Transistors, such as MOSFETs, are the core building block of the vast majority of semiconductor devices. Some semiconductor devices, such as high performance processors, can include millions of transistors. For these devices, decreasing transistor size, and thus increasing transistor density, has traditionally been a high priority in the semiconductor manufacturing area.

Conventional MOSFETs have difficulty scaling below 50 nm fabrication processing. To develop sub-50 nm MOSFETs, double-gate MOSFETs have been proposed. In several respects, double-gate MOSFETs offer better characteristics than the conventional bulk silicon MOSFETs. These improvements arise because the double-gate MOSFET has a gate electrode on both sides of the channel, rather than only on one side as in conventional MOSFETs.

SUMMARY OF THE INVENTION

Implementations consistent with the present invention provide a double-gate MOSFET having a thin channel area and methods of manufacturing the same.

One aspect of the invention is a MOSFET device that includes a source and a drain formed on an insulating layer. The MOSFET device further includes a fin structure formed on the insulating layer between the source and the drain, the fin structure including a first region formed in a channel area of the fin structure; a protective layer formed over at least the first region of the fin structure, the protective layer being wider than the first region; and a gate formed on the insulating layer around at least a portion of the fin structure.

Another aspect of the invention is a method for forming a MOSFET device that includes forming a source, a drain, and a fin structure on an insulating layer, portions of the fin structure acting as a channel for the MOSFET and forming a protective layer above the fin structure. The method further includes trimming the fin structure without significantly trimming the protective layer and depositing a polysilicon layer to act as a gate area for the MOSFET.

Let another aspect of the invention is directed to a device that includes a source and drain. A fin structure is formed between the source and the drain, the fin structure including a first region formed in a channel area of the fin structure and a second and third protective region formed adjacent the source and drain, respectively, wherein the first region is narrower than the second and third protective regions. A gate formed around at least a portion of the fin structure.

BRIEF DESCRIPTION OF THE DRAWINGS

Reference is made to the attached drawings, wherein elements having the same reference number designation may represent like elements throughout.

FIGS. 9 and 10 are cross-section views of the FinFET;

FIGS. 12–15 are cross-section views of a FinFET consistent with a second embodiment of the invention; and FIGS. 16–18 are cross-section views of a double-gate FinFET built around an SiGe layer.

BEST MODE FOR CARRYING OUT THE INVENTION

The following detailed description of the invention refers to the accompanying drawings. The same reference numbers may be used in different drawings to identify the same or similar elements. Also, the following detailed description does not limit the invention. Instead, the scope of the invention is defined by the appended claims and equivalents.

A FinFET, as the term is used herein, refers to a type of MOSFET in which a conducting channel is formed in a vertical Si "fin." FinFETs are generally known in the art.

Figure 1:
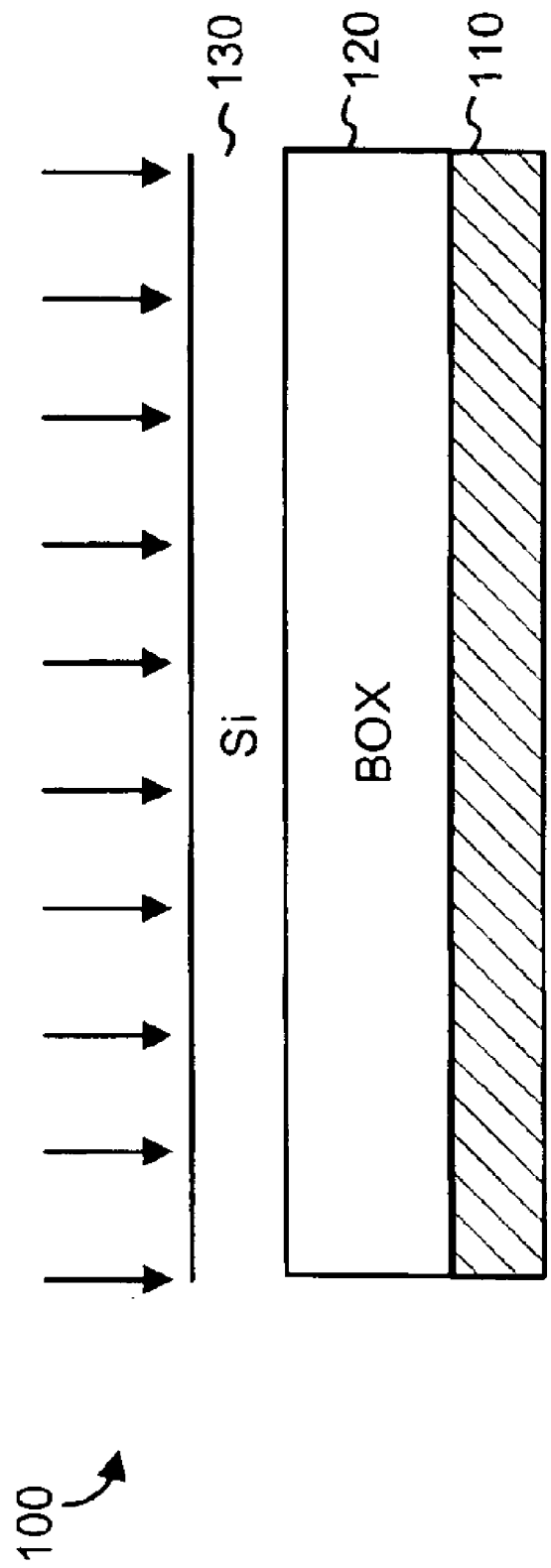
FIGS. 1 and 2 are cross-section views illustrating formation of a FinFET consistent with aspects of the invention.

FIG. 1 is a cross-section illustrating doping of a starting structure for a FinFET 100. FinFET 100 may include a silicon-on-insulation (SOI) structure that includes buried oxide (BOX) layer 120 formed on a silicon and/or germanium substrate 110, with a silicon layer 130 over BOX layer 120. Alternatively, layer 130 may comprise germanium or silicon-germanium. In an exemplary implementation, BOX layer 120 may have a thickness ranging from about 200 nm to about 400 nm and silicon layer 130 may have a thickness ranging from about 30 nm to about 100 nm. A protective layer, such as an oxide layer (e.g., $SiO_2$) and/or a nitride layer (e.g., $Si_3N_4$) may next be deposited to act as a protective cap during subsequent etching.

Figure 2:
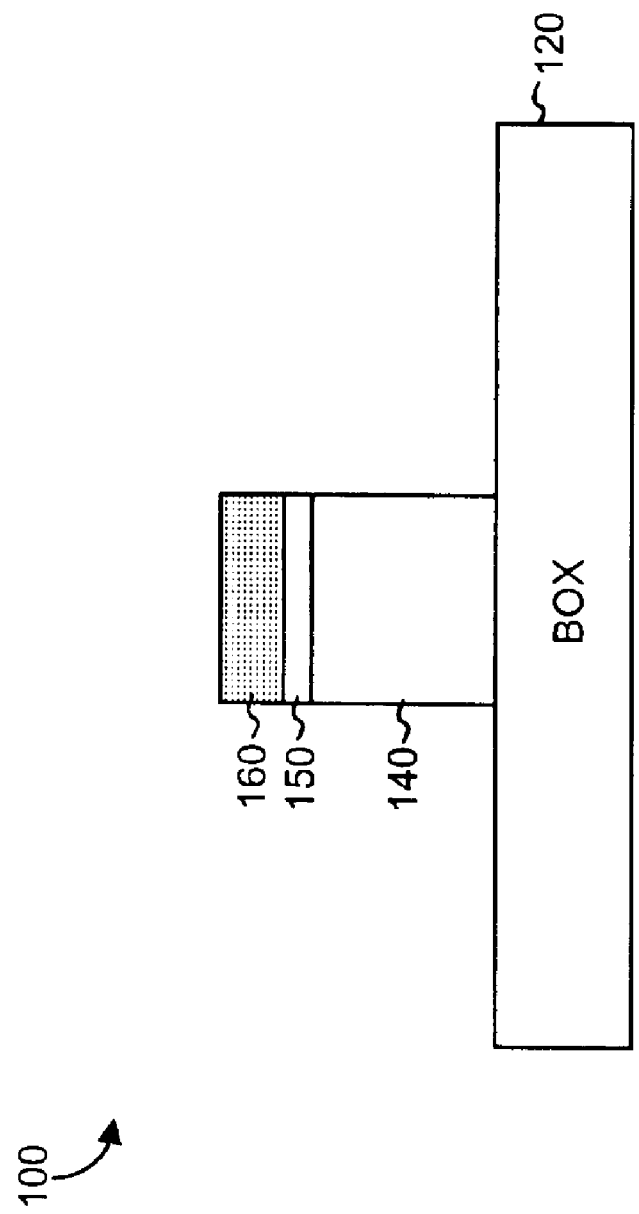

The silicon layer 130 and protective layers may then be etched to form a silicon fin 140 with protective layers 150 and 160 over top of fin 140 (see FIG. 2). Protective layer 150 may be an oxide layer and protective layer 160 may be a nitride layer. Layer 150 may have a thickness of, for example, approximately 15 nm and layer 160 may have a thickness ranging from about 50–75 nm.

Figure 3:
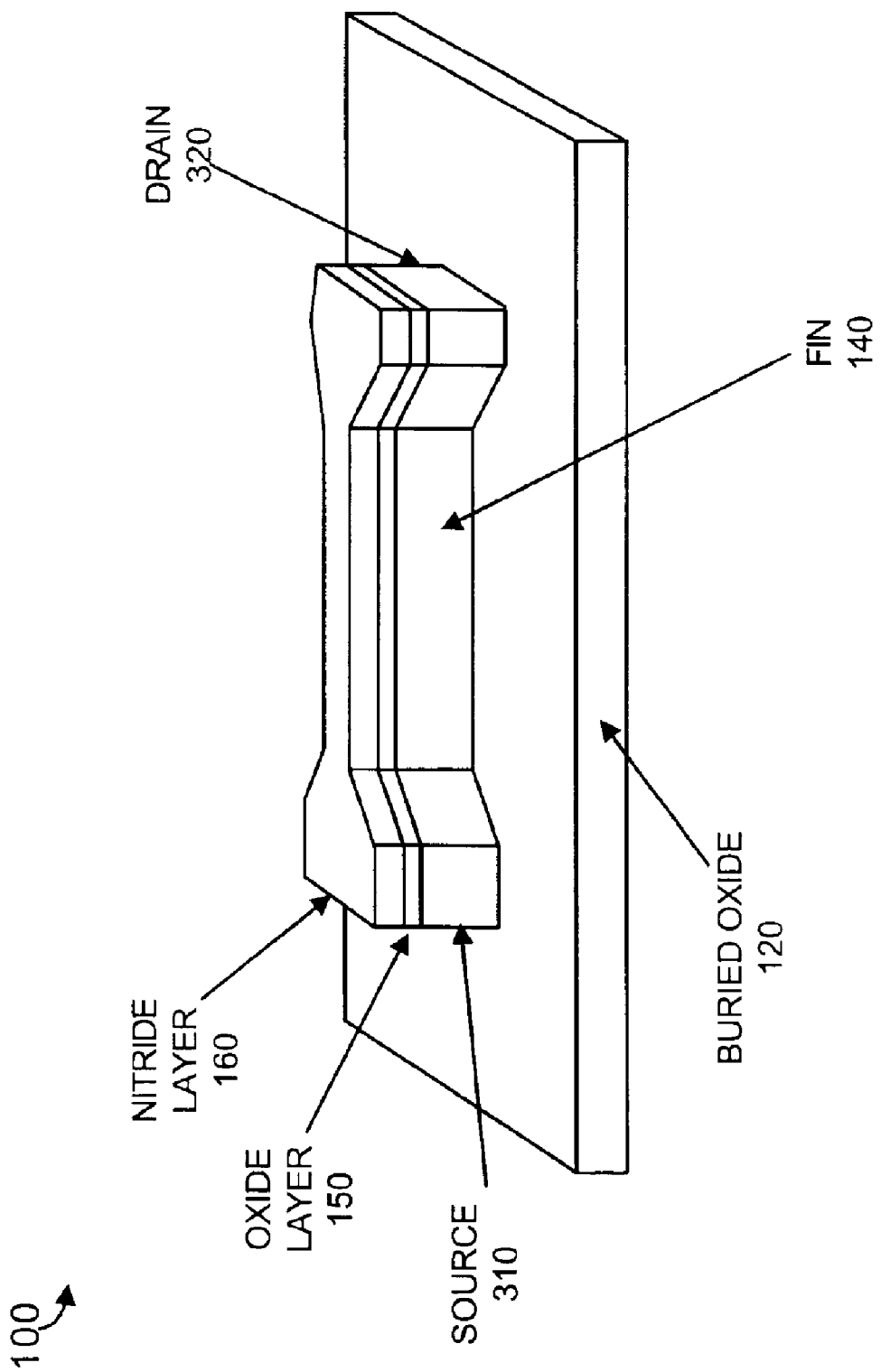
FIG. 3 is a perspective view of the FinFET shown in FIG. 2.

Source/drain regions may then be formed adjacent the ends of fin 140. In one implementation, silicon layer 130 may be patterned and etched to form source and drain regions simultaneously with fin 140. In other implementations, another layer of silicon may be deposited and etched in a conventional manner to form source and drain regions. FIG. 3 is a perspective view of FinFET 100 with source and drain regions 310 and 320 formed adjacent the ends of fin 140.

Figure 4:
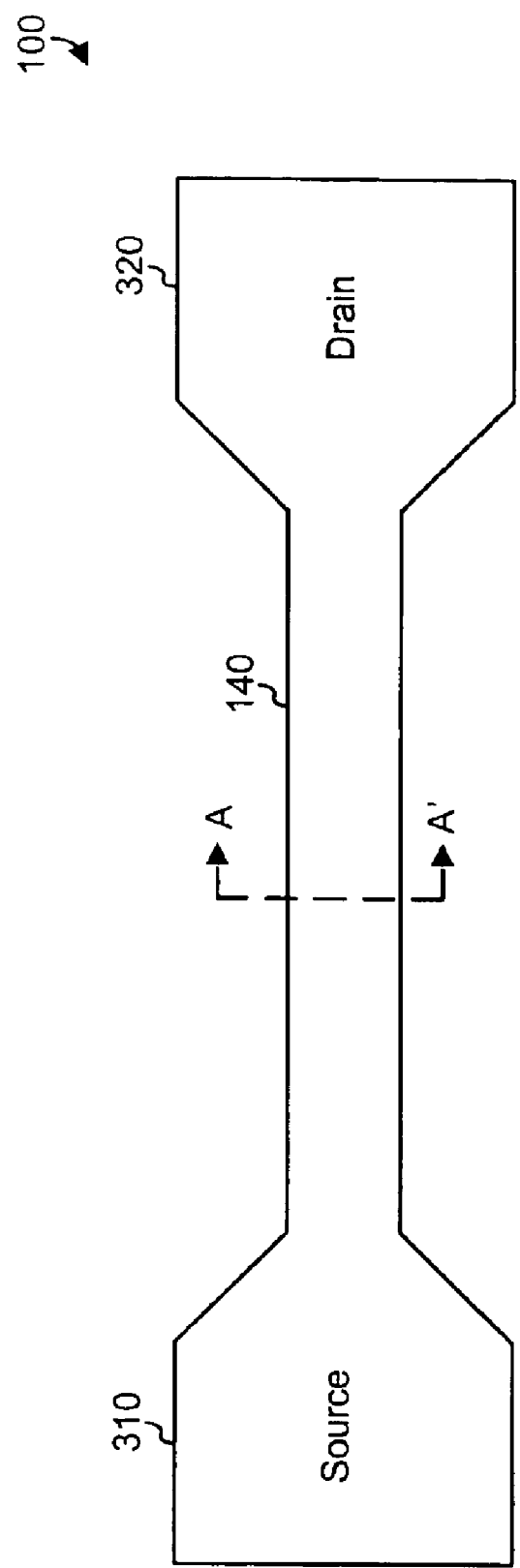
FIG. 4 is a top view of the FinFET shown in FIG. 3.

FIG. 4 is a schematic top-level view of FinFET 100 with source region 310, drain region 320, and fin 140. The cross-sectional views in FIGS. 1 and 2 are taken along the line A–A' in FIG. 4.

Figure 5:
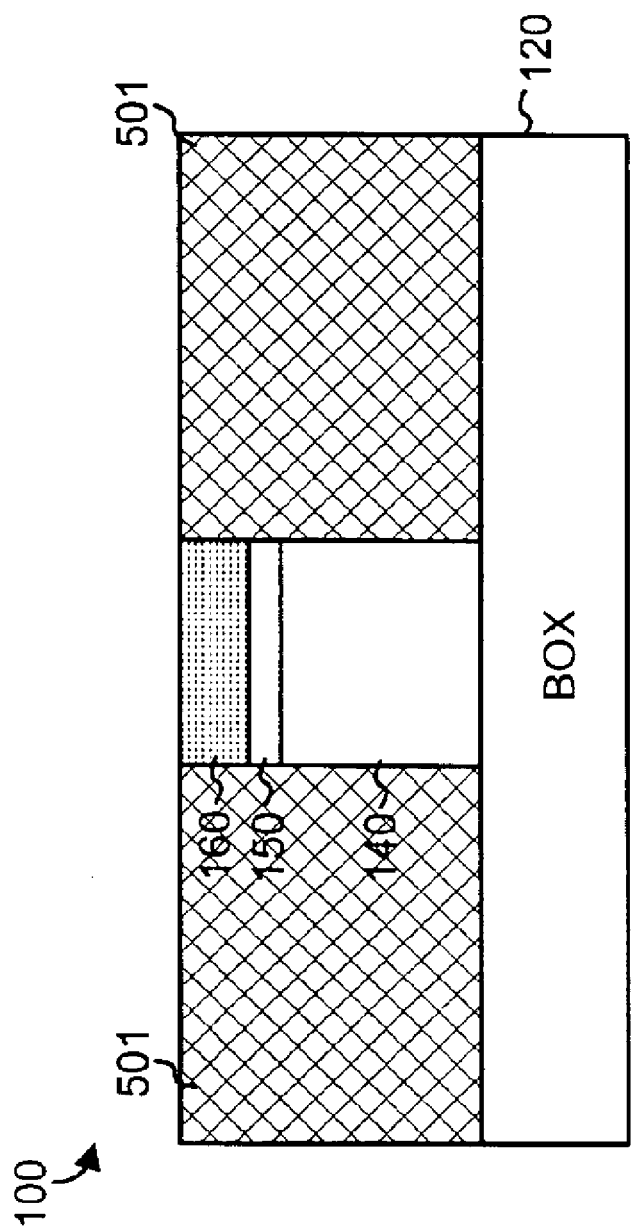
FIG. 5 is a cross-section view taken along the line A–A' in FIG. 4.

A TEOS (tetraethylorthosilicate) layer 501 may next be deposited over FinFET 100. FIG. 5 is a cross-sectional-view of FinFET 100, taken along the line A–A' in FIG. 4, illustrating TEOS layer 501. The TEOS layer 501 may be annealed and planarized to produce a relatively flat surface across the top of FinFET 100.

Figure 6:
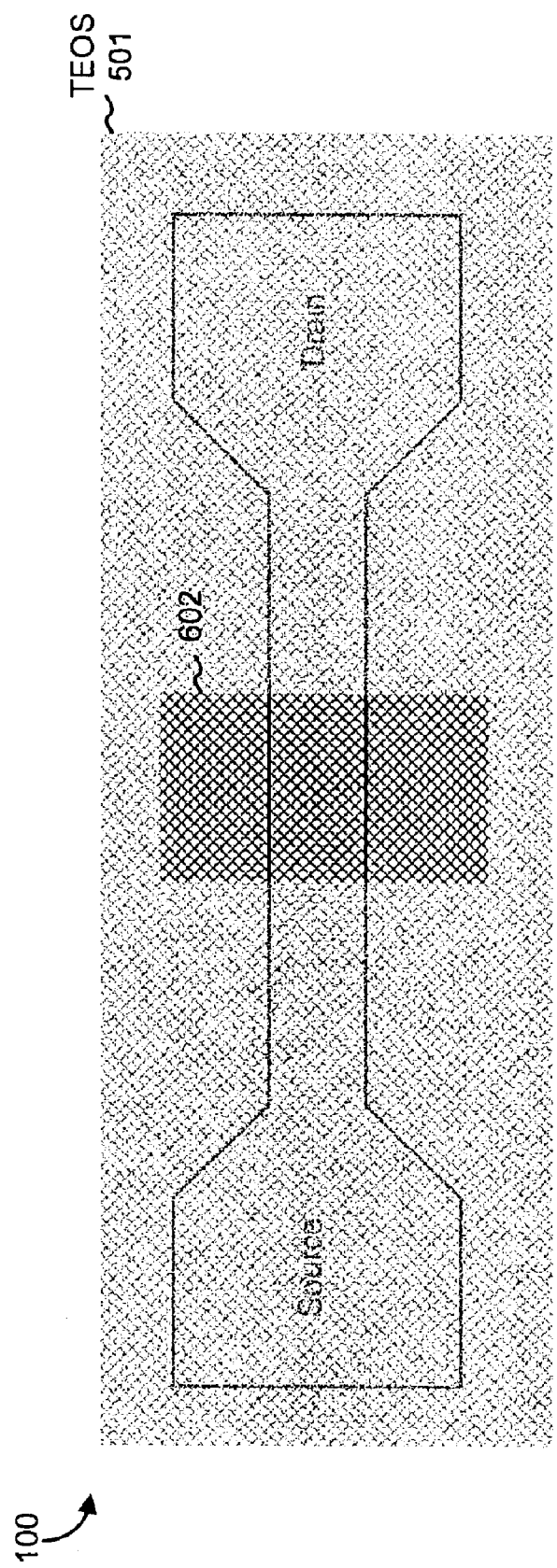
FIG. 6 is a top view of the FinFET shown in FIG. 3.

A damascene gate mask may be defined and patterned in TEOS 501. In particular, a trench may be formed in TEOS 501. The gate area may then be opened in TEOS 501 via etching. FIG. 6 is a diagram illustrating a top-level view of FinFET 100 in which area 602 in TEOS 501 is illustrated as the opened portion. More particularly the mask may be used to allow the TEOS in area 602 to be etched while maintaining the remaining TEOS 501. In one implementation, patterning the gate area to obtain small gate lengths may be performed by depositing a polysilicon layer to a depth of about 50 to 70 nm on the TEOS in area 602. This polysilicon layer may be patterned, leaving very thin polysilicon lines. A layer of oxide may then be deposited to about 120 to 150 nm and then polished back to the top of the polysilicon. Next, the polysilicon is etched away. The TEOS in area 602 is then etched, using the remaining oxide layer as a mask for the TEOS etch.

Figure 7:
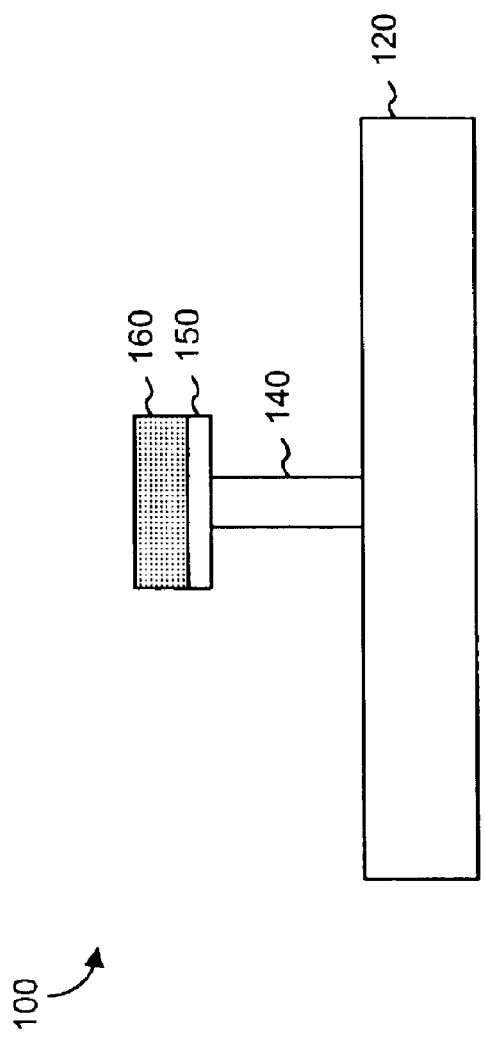
FIG. 7 is a cross-section view taken along the line A–A' in FIG. 4.
Figure 8:
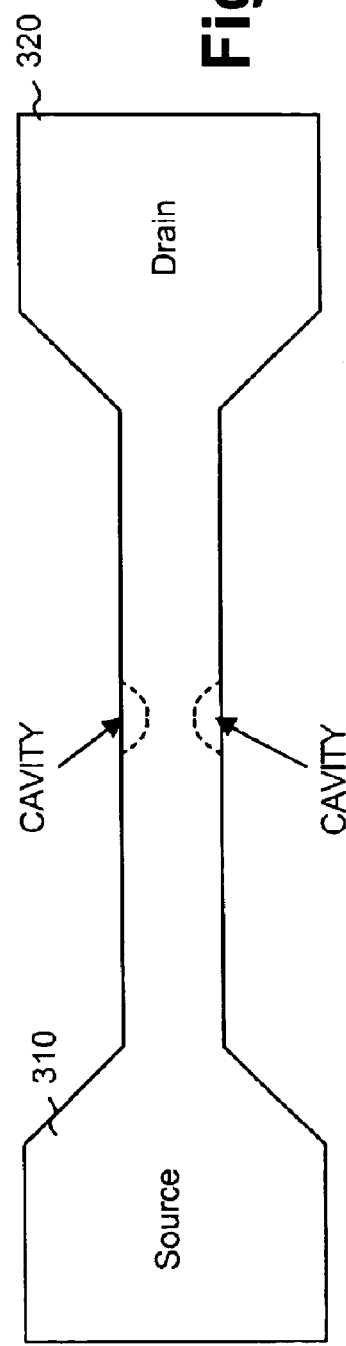
FIG. 8 is a top view of the FinFET shown in FIG. 7.

Fin 140 may next be thinned. In one embodiment, fin 140 may be thinned by exposing FinFET 100 to $NH_4OH$ until fin 140 is reduced from a width of 10 nm to 15 nm to a width of approximately 3 nm to 6 nm. This thinning process may be performed at a relatively slow and controlled pace such that the fin is trimmed at a rate of approximately 2 Å/min. A fin that is thinned in this manner is illustrated in FIG. 7, which is a cross-sectional view taken along the line A–A' in FIG. 4. FIG. 8 is a corresponding top-view of FIG. 7. As shown if FIGS. 7 and 8, FinFET 100, after thinning of fin 140, includes a cavity, formed beneath oxide layer 150 and nitride layer 160.

A gate dielectric layer 901 may be grown on the side surfaces of fin 140 as illustrated in FIG. 9. Gate dielectric layer 901 may be as thin as 0.6 to 1.2 nm. Alternatively, a high-k layer with an equivalent oxide thickness (EOT) of 0.6 to 1.2 nm may be formed on the side surfaces of fin 140.

Referring to FIG. 10, a layer of polysilicon may next be deposited on FinFET 100 in a conventional manner. The layer of polysilicon may be doped using gate doping masks. NMOS devices may be doped with phosphorous and PMOS devices may be doped with boron. The polysilicon may be planarized to the level of nitride layer 160, forming two separate polysilicon areas 1001A and 1001B. The polysilicon areas 1001A and 1001B may be patterned and etched to form the gates of FinFET 100. Polysilicon areas 1001A and 1001B may thus form two electrically independent gates. In other implementations, polysilicon areas 1001A and 1001B may not be polished to the level of $Si_3N_4$ layer 160. Instead, a single polysilicon layer may cover $Si_3N_4$ layer 160. In this situation, the polysilicon layer forms a single addressable gate for FinFET 100.

A mask may next be applied to the gate area 602. Using the mask to protect the gate area 602, the TEOS layer 501 and protective $SiO_2$ and $Si_3N_4$ layers 150 and 160 deposited over the source/drain region 310 and 320, may then be etched using an isotropic wet etch to remove the TEOS layer 501.

After the surface of the source/drain regions 310 and 320 are exposed, ion implantation may be performed on FinFET 100. To dope the source 310 and drain 320. More specifically, for an NMOS FinFET, phosphorous may be implanted at a dosage of $10^{15}$ atoms/cm$^2$ at 5–10 keV. For a PMOS FinFET, boron may be implanted at a dosage of $10^{15}$ atoms/cm$^2$ at 2–5 keV.

Figure 11:
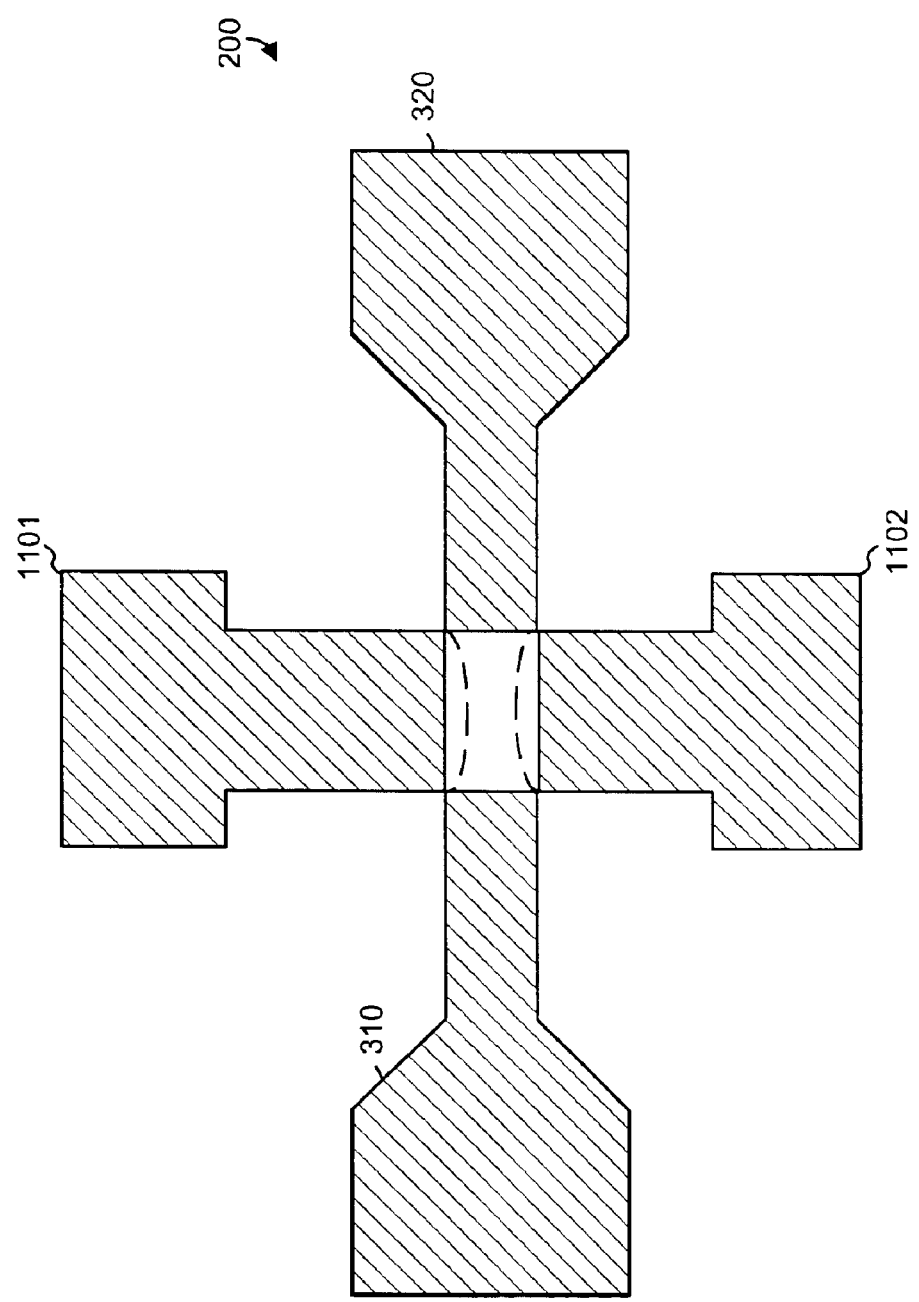
FIG. 11 is a top view of a complete FinFET.

After ion implantation, salicidation (i.e., a self-aligned silicide process) may be performed on FinFET 100. In this act, a metal, such as tungsten, cobalt, titanium, tantalum molybdenum, nickel, eribium, or platinum may be deposited over the polysilicon (gate) area 1001A and 1001B and source and drain regions 310 and 320. A thermal annealing may then be performed to create a metal-silicide compound. FIG. 11 illustrates a top-view of FinFET 100 after the annealing. Referring to FIG. 11, the cross-hatching represents the metal-silicide compound over source/drain regions 310 and 320 and the two gate regions. The gate regions may include gate pads 1101 and 1102 formed at the end of polysilicon areas 1001A and 1001B. The resulting FinFET 100 includes a thin fin channel area 140, as indicated by the dotted lines in FIG. 11. The protective layers 150 and 160, however, are wider than fin 140, as illustrated in FIG. 10. Advantageously, the resulting thin channel MOSFETs provides improved short channel control.

Referring back to FIG. 5, in an alternate embodiment, instead of thinning fin 140 by exposing it to $NH_4OH$, fin 140 may be trimmed through a reactive ion etching (RIE) process. In general, and as is known in the art, RIE is a variation of plasma etching in which during the etching, the semiconductor wafer is placed on an RF powered electrode. In this embodiment, the fin 140 may initially be thinned by RIE to reduce the width of fin 140 to a width of approximately 3 nm to 6 nm.

Protective layers 150 and 160 may next be removed through an etch process to expose the fin, labeled as fin 1240 in FIG. 12.

To remove etch damage caused by the etching of layers 150 and 160, a sacrificial oxidation layer 1301 may next be formed on the exposed surfaces of fin 1240, as illustrated in FIG. 13. Sacrificial oxide layer may be grown or formed to a thickness of about 0.6 nm to 1.2 nm and may also function as a gate dielectric layer. Alternatively, an additional oxide layer or high-k layer with an equivalent oxide thickness (EOT) of 0.6 to 1.2 nm may be formed on the side surfaces of fin 140, labeled as layers 1401.

Referring to FIG. 15, a layer of polysilicon may next be deposited on FinFET 1200 in a conventional manner. The polysilicon may be planarized to the level of oxide layer 1301, forming two separate polysilicon areas 1201A and 1201B. The polysilicon areas 1201A and 1201B may form the gates of FinFET 1200. Polysilicon areas 1201A and 1201B may thus form two electrically independent gates. In other implementations, polysilicon areas 1201A and 1201B may not be polished to the level of oxide layer 1301. Instead, a single polysilicon layer may cover oxide layer 1301. In this situation, the polysilicon layer forms a single addressable gate for FinFET 1200.

A mask may next be applied to the gate area of FinFET 1200. With the mask to protect the gate area, TEOS layer 501 and the additional protective layers deposited over the source/drain region 310 and 320 may then be etched away from the rest of the FinFET 1200.

After the surface of the source/drain regions 310 and 320 are exposed, ion implantation may be performed on FinFET 1200. This effectively dopes the source 310 and drain 320. More specifically, for an NMOS FinFET, phosphorous may be implanted at a dosage of $10^{15}$ atoms/cm$^2$ at 5–10 keV. For a PMOS FinFET, boron may be implanted at a dosage of $10^{15}$ atoms/cm$^2$ at 2–5 keV.

After ion implantation, salicidation (i.e., a self-aligned silicide process) may be performed on FinFET 1200. In this act, a metal, such as tungsten, cobalt, titanium, tantalum or molybdenum, may be deposited over the polysilicon (gate) area 1201A and 1201B and source and drain regions 310 and 320. A thermal annealing may then be performed to create a metal-silicide compound. At this point, a top-view of FinFET 1200 is similar to the FinFET 200 shown in FIG. 11.

OTHER IMPLEMENTATIONS

Figure 16:
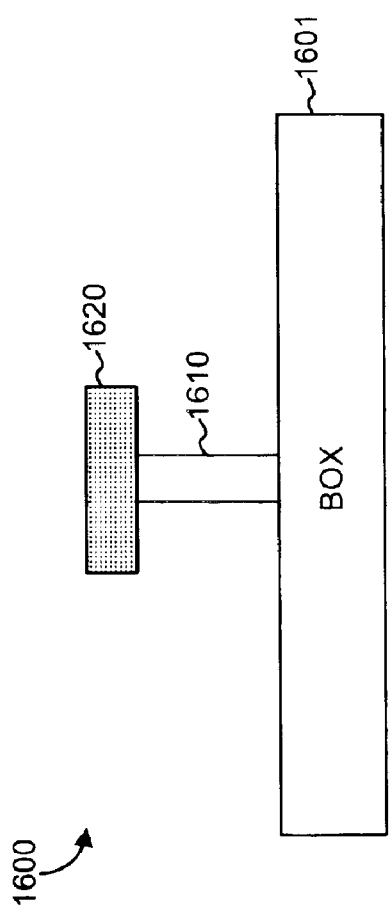
Figure 17:
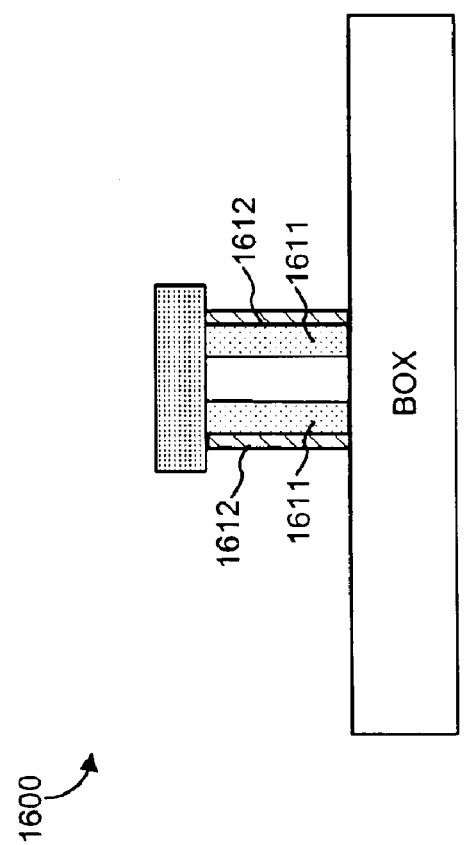

In some situations it may be desirable to form strained silicon FinFETs. FIGS. 16–18 are cross-sectional views of a FinFET 1600 taken along the line A–A' in FIG. 4.

Referring to FIG. 16, a SiGe layer 1610 may be formed on a buried-oxide layer 1601. A nitride layer 1620 may be formed above the SiGe layer 1610. The arrangement of SiGe layer 1610 and nitride layer 1620 may be formed, for example, in a manner similar to the thin fin shown in FIG. 7. Thus, SiGe layer 1610 and nitride layer 1620 may be initially etched to have the same width and SiGe layer 1610 may then be laterally etched to form a thin SiGe layer 1610. SiGe layer 1610 may be about 5 nm to 15 nm wide.

Referring to FIG. 17, Si layers 1611 may next be epitaxially grown around the SiGe layer to a width of about 5 nm to 10 nm. The growth of Si layers 1611 may be followed by the formation of gate dielectric layers 1612. Gate dielectric layers 1612 may be as thin as 0.6 to 1.2 nm.

Referring to FIG. 18, a polysilicon layer 1801 may next be deposited on FinFET 1600 in a conventional manner. The polysilicon layer may then be patterned and etched to form gates of FinFET 1600. Polysilicon layer 1801 may also be planarized down to the level of nitride layer 1620. At this point, FinFET 1600 may be completed in the manner described above.

Some MOSFETs have both PMOS and NMOS FinFETS placed on a single buried oxide layer. When performing salicidation in this implemetation (e.g., salicidation as described above), selective salicidation may be achieved by electroless plating of an appropriate metal. In addition, two or more different silicides may be used. One silicide (e.g., Co, Ni, rare earth metals Er, Eu, Ga, Sm) may be used for the NMOS FinFETs and another silicide (e.g., Pt) may be used for PMOS FinFETs. In this situation, the PMOS FinFETs may first be covered by a photoresist and then the NMOS metal may be deposited. The photoresist over the PMOS FinFETs may then be removed and another photresist layer may be applied over the NMOS FinFETs. At this point, the PMOS metal may be applied. A thermal annealing may then be performed to create the metal-silicide compound.

CONCLUSION

FinFETs having a narrow fin, and methods of making the narrow fin FinFETs, were described herein. The narrow fin provides a number of advantages to the FinFET, including better short channel control.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed.

The present invention is applicable in the manufacturing of semiconductor devices and particularly in semiconductor devices with design features of 100 nm and below, resulting in increased transistor and circuit speeds and improved reliability. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A MOSFET device comprising:
   a source and a drain formed on an insulating layer;
   a fin structure formed on the insulating layer between the source and the drain, the fin structure including a first region formed in a channel area of the fin structure;
   a dielectric layer formed around at least a channel portion of the fin structure to a thickness ranging from 0.6 nm to less than 1.0 nm;
   a protective layer formed over at least the first region of the fin structure, the protective layer being wider than the first region and including an oxide layer and a nitride layer formed over the oxide layer and having a thickness ranging from 50 nm to 75 nm; and a gate formed on the insulating layer around at least a portion of the fin structure.

2. The MOSFET device of claim 1, wherein the first region has a width of about 3 to 6 nm.

3. The MOSFET device of claim 1, wherein the gate comprises polysilicon.

4. The MOSFET device of claim 1, wherein the MOSFET device is a FinFET.

5. The MOSFET device of claim 1, wherein the gate is formed to include small gate lengths.

6. A method for forming a MOSFET device comprising:

forming a source, a drain, and a fin structure on an insulating layer, portions of the fin structure acting as a channel for the MOSFET;

forming a protective layer above the fin structure;

depositing a tetraethyorthosilicate (TEOS) layer over the MOSFET device before trimming the fin structure;

forming a polysilicon layer to a thickness ranging from about 50 nm to 70 nm on the TEOS layer;

trimming the fin structure without significantly trimming the protective layer; and depositing a second polysilicon layer to act as a gate area for the MOSFET.

7. The method of claim 6, wherein the fin structure is trimmed by exposing the fin structure to $NH_4OH$.

8. The method of claim 6, wherein forming the protective layer includes:

depositing an oxide layer to a depth of about 15 nm, and depositing a nitride layer to a depth of about 50 nm to 75 nm.

9. The method of claim 6, further comprising:

etching away the TEOS layer over the fin structure before trimming the fin structure.

10. The method of claim 6, wherein trimming the fin structure includes trimming the fin structure to a width of about 3 nm to 6 nm.

* * * * *